(12) United States Patent
Yamazaki (10) Patent No.: US 7,323,873 B2
(45) Date of Patent: Jan. 29, 2008

(54) PHASE ERROR MEASURING METHOD, MR IMAGING METHOD, AND MRI SYSTEM

(75) Inventor: Aki Yamazaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 126 days.

(21) Appl. No.: 11/290,750

(22) Filed: Nov. 30, 2005

(65) Prior Publication Data

US 2006/0116569 A1    Jun. 1, 2006

(30) Foreign Application Priority Data

Dec. 1, 2004    (JP) .............................. 2004-348400

(51) Int. Cl.
*G01V 3/00* (2006.01)
(52) U.S. Cl. ...................................... 324/309; 324/307
(58) Field of Classification Search ................ 324/309, 324/307, 306
See application file for complete search history.

(56) References Cited

U.S. PATENT DOCUMENTS

| | | | |
|---|---|---|---|
| 6,472,873 B2 | 10/2002 | Yamazaki | |
| 6,617,850 B2 * | 9/2003 | Welch et al. | 324/309 |
| 6,664,787 B2 | 12/2003 | Miyoshi et al. | |
| 7,030,609 B2 * | 4/2006 | Pipe | 324/309 |
| 2002/0047708 A1 | 4/2002 | Miyoshi et al. | |

FOREIGN PATENT DOCUMENTS

| | | |
|---|---|---|
| JP | 08-322817 | 12/1996 |
| JP | 10-075940 | 3/1998 |
| JP | 2002-143115 | 5/2002 |

* cited by examiner

*Primary Examiner*—Louis M. Arana
(74) *Attorney, Agent, or Firm*—Armstrong Teasdale LLP (57) ABSTRACT

The present invention is intended to provide a phase error measuring method capable of measuring a phase error occurring in each phase encoding direction that corresponds to the direction of a readout magnetic field gradient which is turned in units of a radian. The phase error measuring method in accordance with the present invention is implemented in a magnetic resonance imaging (MRI) apparatus that performs a K-space filling scan to define data in a K-space having readout lines formed along a Kx axis, a Ky axis, and a mixed axis of them. The phase error measuring method includes a plurality of phase error measurement steps of measuring a phase error that occurs in each phase encoding direction corresponding to the direction of a readout magnetic field gradient which is turned in units of a radian.

19 Claims, 10 Drawing Sheets

Propeller Produces data by Turning a Blade with the Origin of a K-Space as a Center.

FIG. 14

FIG. 15

PHASE ERROR MEASURING METHOD, MR IMAGING METHOD, AND MRI SYSTEM

CROSS REFERENCE TO RELATED APPLICATIONS

This application claims the benefit of Japanese Application No. 2004-384400 filed Dec. 1, 2004.

BACKGROUND OF THE INVENTION

The present invention relates to a phase error measuring method, an MR imaging method, and a magnetic resonance imaging (MRI) apparatus. More particularly, the present invention is concerned with a phase error measuring method for measuring a phase error that occurs in each phase encoding direction corresponding to the direction of a readout magnetic field gradient that is turned in units of a radian, an MR imaging method of performing a main scan by compensating phase errors, and an MRI apparatus in which the methods are implemented.

Patent Document 1 and Patent Document 2 have disclosed an MR imaging method in which a compensatory component intended to suppress an adverse effect on a spin echo, which succeeds a spin echo derived from application of a phase-encoding magnetic field gradient, caused by remanent magnetization or eddy currents attributable to the phase encoding magnetic field gradient is applied as a compensatory pulse before, after, or before and after application of either the phase encoding magnetic field gradient or a rewinding magnetic field gradient, and an MR imaging method of applying the compensatory component to the magnetic field gradient itself.

Moreover, Patent Document 3 has disclosed an MR imaging method capable of suppressing an adverse effect on a spin echo, which succeeds a spin echo derived from application of a phase encoding magnetic field gradient, caused by remanent magnetization or eddy currents attributable to the phase encoding magnetic field gradient, and capable of suppressing an adverse effect on the spin echo derived from the application of the phase encoding magnetic field gradient.

Moreover, conventional MR imaging methods include a method called as a PROPELLER (Periodically Rotated Overlapping Parallel Lines with Enhanced Reconstruction) method. In general, the PROPELLER method is employed in combination with a fast spin echo (FSE) imaging technique. According to the PROPELLER method, a unit called a blade is employed, and data acquired in units of a blade according to the FSE imaging technique is defined in a K-space. The blade is turned with the origin of the K-space as a center in order to produce data (an imaging method in which a data filling trajectory along with data is defined in the K-space is turned with the origin of the K-space as a center). Consequently, the resultant blades of data items are used to correct motion data highly accurately. This imaging method can largely reduce artifacts affecting imaging of a patient who makes motions.

[Patent Document 1] Japanese Unexamined Patent Publication No. 8(1996)-322817

[Patent Document 2] Japanese Unexamined Patent Publication No. 10(1998)-75940

[Patent Document 3] Japanese Unexamined Patent Publication No. 2002-143115

However, according to the conventional PROPELLER method, a readout magnetic field gradient is turned in units of a radian. Although a phase error occurs in a phase encoding direction along with the turning of the readout magnetic field gradient, the phase error is not compensated. This poses a problem in that when image data is acquired by performing a main scan, an accurate phase encoding quantity is not applied in every phase encoding direction.

SUMMARY OF THE INVENTION

Therefore, an object of the present invention is to provide a phase error measuring method capable of measuring a phase error that occurs in each phase encoding direction corresponding to the direction of a readout magnetic field gradient that is turned in units of a radian, an MR imaging method capable of compensating the phase error, and an MRI apparatus in which the methods are implemented.

According to the first aspect of the present invention, there is provided a phase error measuring method to be implemented in an MRI apparatus that performs a K-space filling scan so as to define data in a K-space having readout lines defined along a Kx axis, a Ky axis, and a mixed axis of them. Herein, the phase error measuring method includes a plurality of phase error measuring steps of measuring a phase error that occurs in each phase encoding direction corresponding to the direction of a readout magnetic field gradient that is turned in units of a radian.

According to the second aspect of the present invention, there is provided a phase error measuring method to be implemented in an MRI apparatus that performs a K-space filling scan so as to define data in a K-space having readout lines along a Kx axis, a Ky axis, a Kz axis, and a mixed axis of them. Herein, the phase error measuring method includes a plurality of phase error measuring steps of measuring a phase error that occurs in each phase encoding direction corresponding to the direction of a readout magnetic field gradient that is turned in units of a radian.

According to the third aspect of the present invention, at the phase error measuring steps, a phase error is measured in units of a blade that is a unit of data to be acquired. A compensatory component for use in compensating a phase error is calculated for all phase-encoding magnetic field gradients that are defined to be included in a blade.

According to the fourth aspect of the present invention, at the phase error measuring steps, a phase error is measured in units of a blade that is a unit of data to be acquired. A compensatory component for use in compensating a phase error is calculated for phase-encoding magnetic field gradients arbitrarily selected from among all phase-encoding magnetic field gradients that are defined to be included in a blade.

According to the fifth aspect of the present invention, a compensatory component for use in compensating a phase error of a phase-encoding magnetic field gradient which has not been measured is interpolated.

According to the sixth aspect of the present invention, at the plurality of phase error measuring steps, a phase error is measured in all phase encoding directions corresponding to directions in which a readout magnetic field gradient is turned in units of a radian.

According to the seventh aspect of the present invention, at the plurality of phase error measuring steps, a phase error is measured in a plurality of phase encoding directions arbitrarily selected from among all phase encoding directions corresponding to directions in which a readout magnetic field gradient is turned in units of a radian.

According to the eight aspect of the present invention, a compensatory component for use in compensating a phase error that occurs in a phase encoding direction and that has not been measured is calculated through interpolation.

According to the ninth aspect of the present invention, there is provided an MR imaging method including a correcting step of correcting a main scan pulse sequence according to the results of phase error measurement, and a scanning step of using the pulse sequence updated through the correction to perform a main scan so as to acquire data.

According to the tenth aspect of the present invention, there is provided an MRI apparatus including a computer means that has the ability to control execution of phase error measurement.

According to the eleventh aspect of the present invention, the computer means corrects a main scan pulse sequence according to the results of phase error measurement performed according to the phase error measuring method, stores the pulse sequence, which is updated through correction, in a predetermined storage area, and uses the updated pulse sequence to perform a main scan.

In a phase error measuring method, an MR imaging method, and an MRI apparatus in accordance with the present invention, a phase error occurring in each phase encoding direction corresponding to the direction of a readout magnetic field gradient, which is turned in units of a radian, is measured and compensated. During data acquisition, an accurate phase-encoding quantity can be defined on a phase encoding line corresponding to a readout line formed along a Kx axis, a Ky axis, and a mixed axis of them or along the Kx axis, the Ky axis, a Kz axis, and a mixed axis of them. Consequently, compared with related arts, blurs or artifacts in images can be reduced to a great extent.

Namely, a phase error measuring method and an MR imaging method in accordance with the present invention will prove helpful when they are implemented in MRI apparatuses that perform a K-space filling scan so as to define data in a K-space having readout lines formed along a Kx axis, a Ky axis, and a mixed axis of them or perform a K-space filling scan so as to define data in a K-space having readout lines along the Kx axis, the Ky axis, a Kz axis, and a mixed axis of them.

Further objects and advantages of the present invention will be apparent from the following description of the preferred embodiments of the invention as illustrated in the accompanying drawings.

DETAILED DESCRIPTION OF THE INVENTION

A phase error measuring method, an MR imaging method, and an MRI apparatus in accordance with an embodiment of the present invention will be described in conjunction with drawings below. Noted is that the present invention will not be limited to the embodiment.

Figure 1:
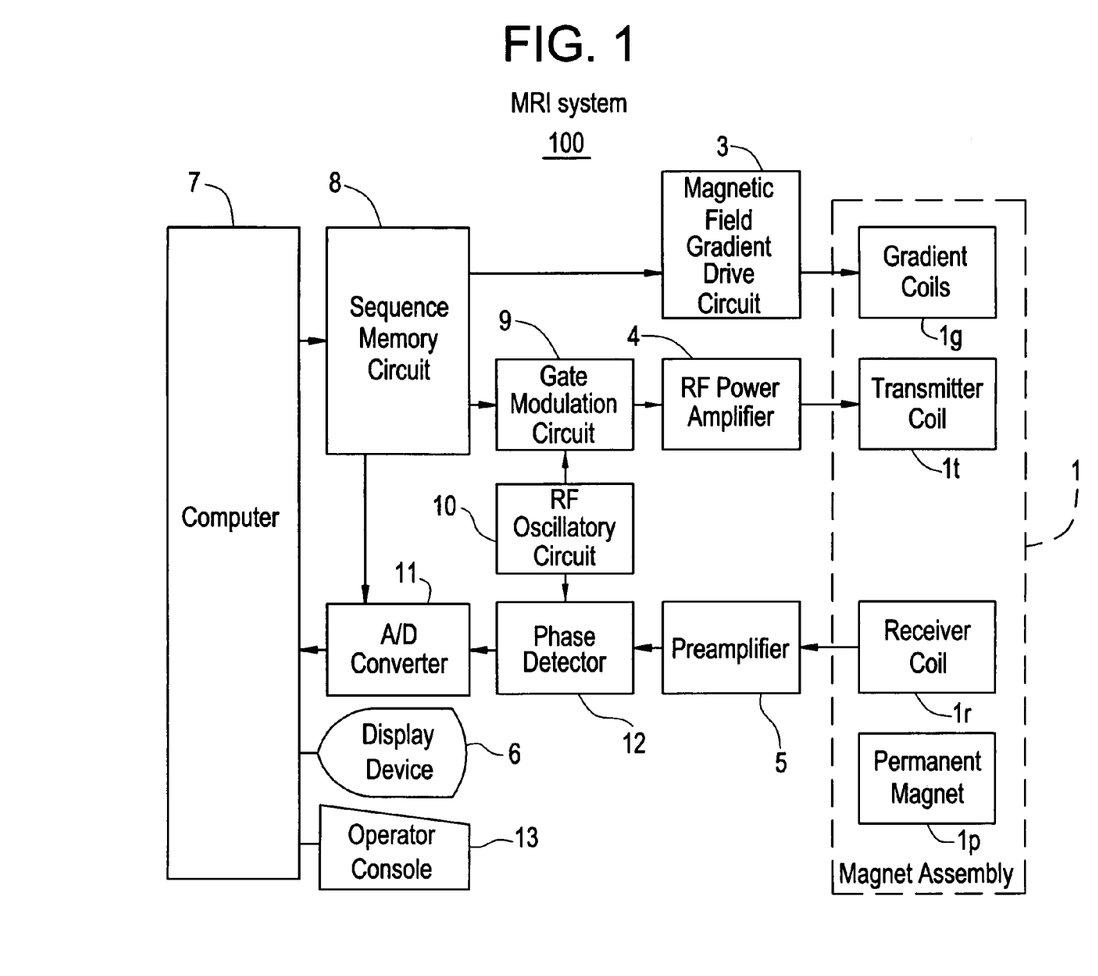
FIG. 1 shows an example of the configuration of an MRI apparatus in accordance with the present invention.

FIG. 1 shows an example of the configuration of an MRI apparatus in accordance with the present invention. In the MRI apparatus 100, a magnet assembly 1 has a bore into which a subject is carried. A permanent magnet 1p that applies a homogeneous main magnetic field to the subject, gradient coils 1g that produce magnetic field gradients along x, y, and z axes respectively, a transmitter coil it that applies RF pulses for the purpose of exciting spins of nucleus in the subject, and a receiver coil 1r that detects a nuclear magnetic resonance (NMR) signal induced in the subject are disposed to surround the bore. The gradient coils 1g, transmitter coil 1t, and receiver coil 1r are connected to a magnetic field gradient drive circuit 3, an RF power amplifier 4, and a preamplifier 5 respectively. Incidentally, a superconducting magnet may be substituted for the permanent magnet 1p.

The magnetic field gradient drive circuit 3 is operated according to a pulse sequence, which is stored in a sequence memory circuit 8, in response to a command sent from a computer 7. The magnetic field gradient drive circuit 3 causes the gradient coils 1g, which are incorporated in the magnet assembly 1, to produce respective magnetic field gradients. Moreover, a gate modulation circuit 9 is operated to modulate a carrier output signal of an RF oscillatory circuit 10 into a pulsating signal that exhibits a predetermined timing and a predetermined envelope. The gate modulation circuit 9 applies a resultant pulsating signal as an RF pulse to the RF power amplifier 4, and the RF power amplifier 4 amplifies the power of the RF pulse. Thereafter, the amplified RF pulse is applied to the transmitter coil it incorporated in the magnet assembly 1. Consequently, a desired scan section is selected and excited.

The preamplifier 5 amplifies an NMR signal that is induced in the subject and detected by the receiver coil 1r incorporated in the magnet assembly 1, and transfers it to a phase detector 12. The phase detector 12 uses a carrier output signal of the RF oscillatory circuit 10 as a reference signal to detect the phase of the NMR signal received from the preamplifier 5, and transfers the resultant signal to an A/D converter 11. The A/D converter 11 converts the analog signal, which has the phase thereof detected, into digital data, and transfers the digital data to the computer 7.

The computer 7 controls a phase error measuring method and an MR imaging method in accordance with the present invention. Moreover, the computer 7 receives digital data from the A/D converter 11, performs arithmetic operations to achieve image reconstruction, and thus reconstructs MR images of a scan section. Furthermore, the computer 7 receives information entered at an operator console 13 and controls the entire apparatus. MR images are displayed on a display device 6.

The MRI apparatus having the foregoing components shall adopt, for example, the PROPELLER method and acquire data in units of a blade that is an idea employed in the FSE imaging technique. The PROPELLER is one of radial scanning methods and is an imaging technology of defining data in a K-space while turning a plurality of phase encoding lines (which is included in a blade) during every repetition time that has a significant meaning in the FSE imaging technique.

An example of phase error measurement in accordance with the present embodiment will be described in conjunction with drawings. For example, when data is acquired according to the PROPELLER method, different phase errors occur in respective phase encoding directions. This causes blurs or artifacts to appear in images. According to the present embodiment, a phase error occurring in each phase encoding direction is measured and compensated in order to reduce the blurs or artifacts in images. Incidentally, a phase error to be compensated is a phase error of a magnetic field gradient that cannot be compensated after acquisition of image data.

Figure 2:
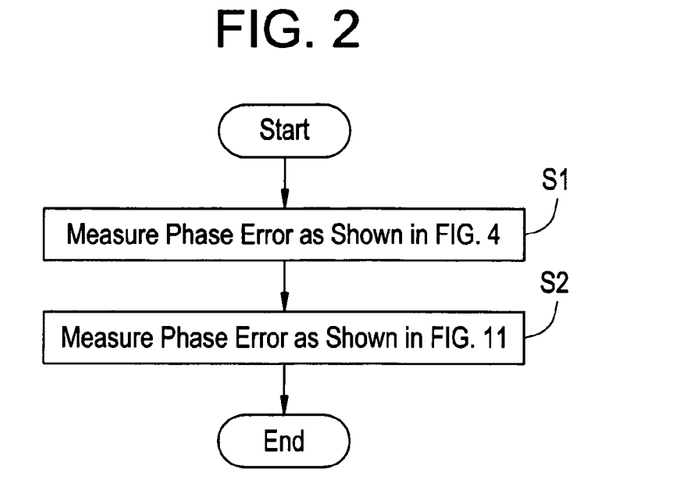
FIG. 2 is a flowchart describing an example of phase error measurement.
Figure 3:
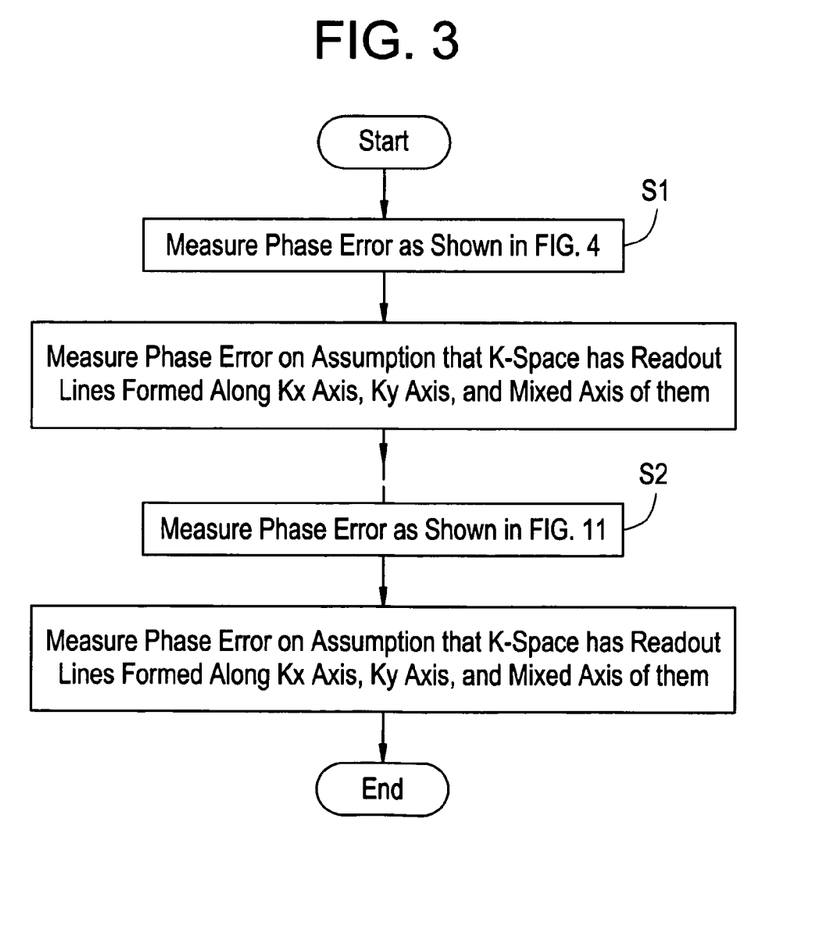
FIG. 3 is a flowchart describing an example of phase error measurement.

FIG. 2 is a flowchart describing an example of phase error measurement in accordance with the present embodiment. Specifically, phase error measurement is described as an example to be applied to a case where the PROPELLER method is adopted with an echo train length (ETL) set to four echoes and the number of blades set to two. FIG. 2 describes the phase error measurement on the assumption that a K-space has readout lines formed along Kx and Ky axes. The same applies to a K-space that has, as described in FIG. 3, readout lines formed along the Kx and Ky axes as well as a mixed axis thereof. Namely, according to the present embodiment, a phase error is measured in association with all axes (corresponding to the number of blades) defined in a K-space, that is, the Kx axis, Ky axis, and the mixed axis thereof.

Figure 4:
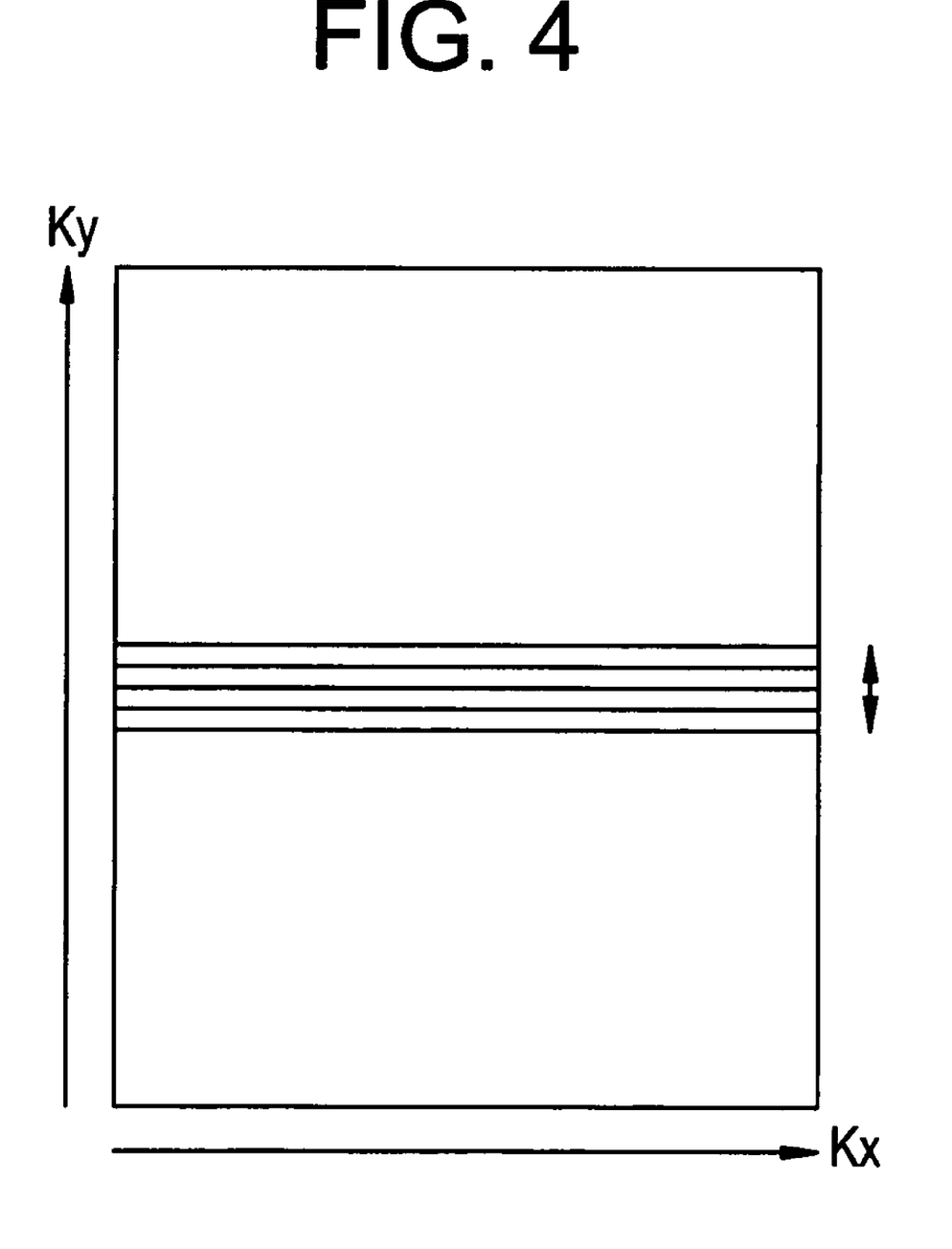
FIG. 4 shows phase error measurement of step S1 described in FIG. 2.

To begin with, the computer 7 measures a phase error occurring in a phase encoding direction corresponding to the direction of a specific readout line formed in a blade in parallel with the Kx axis (step S1). FIG. 4 shows phase error measurement of step S1.

Figure 5:
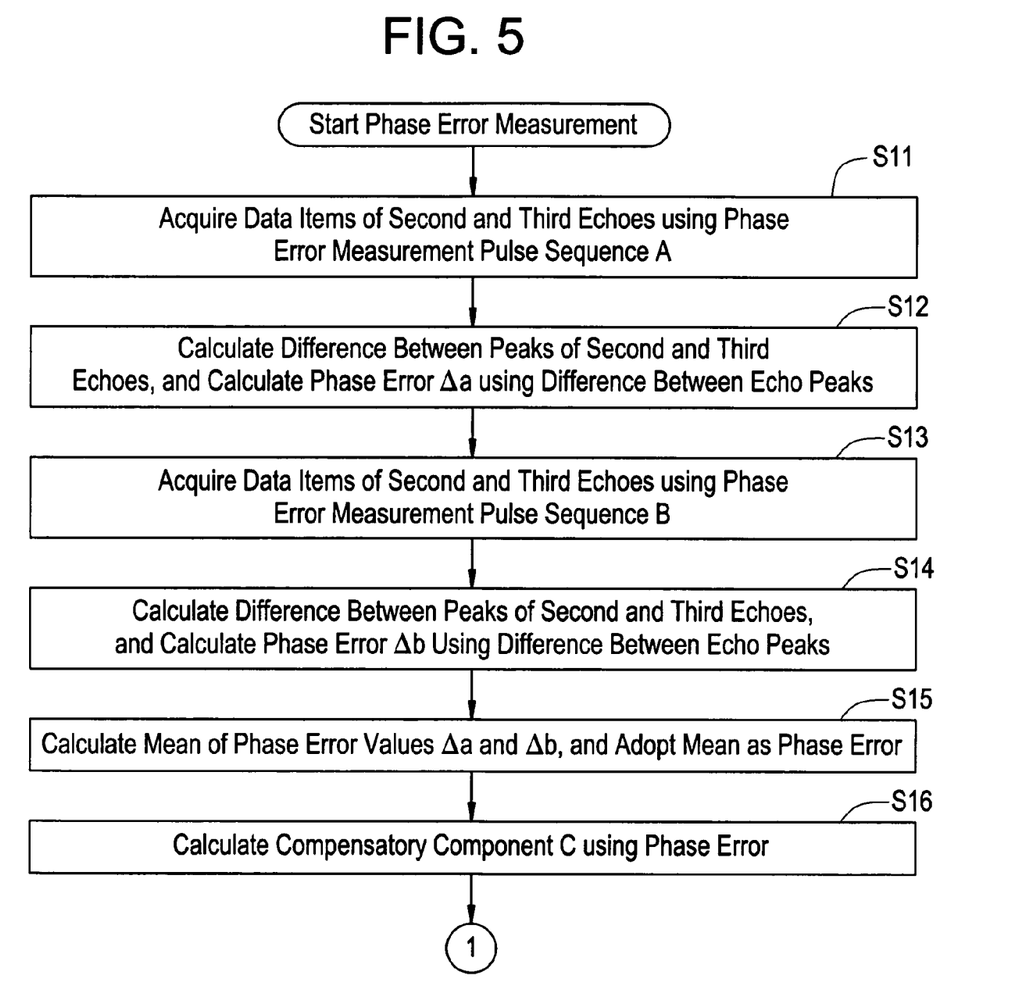
FIG. 5 is a flowchart describing a concrete example of phase error measurement.
Figure 6:
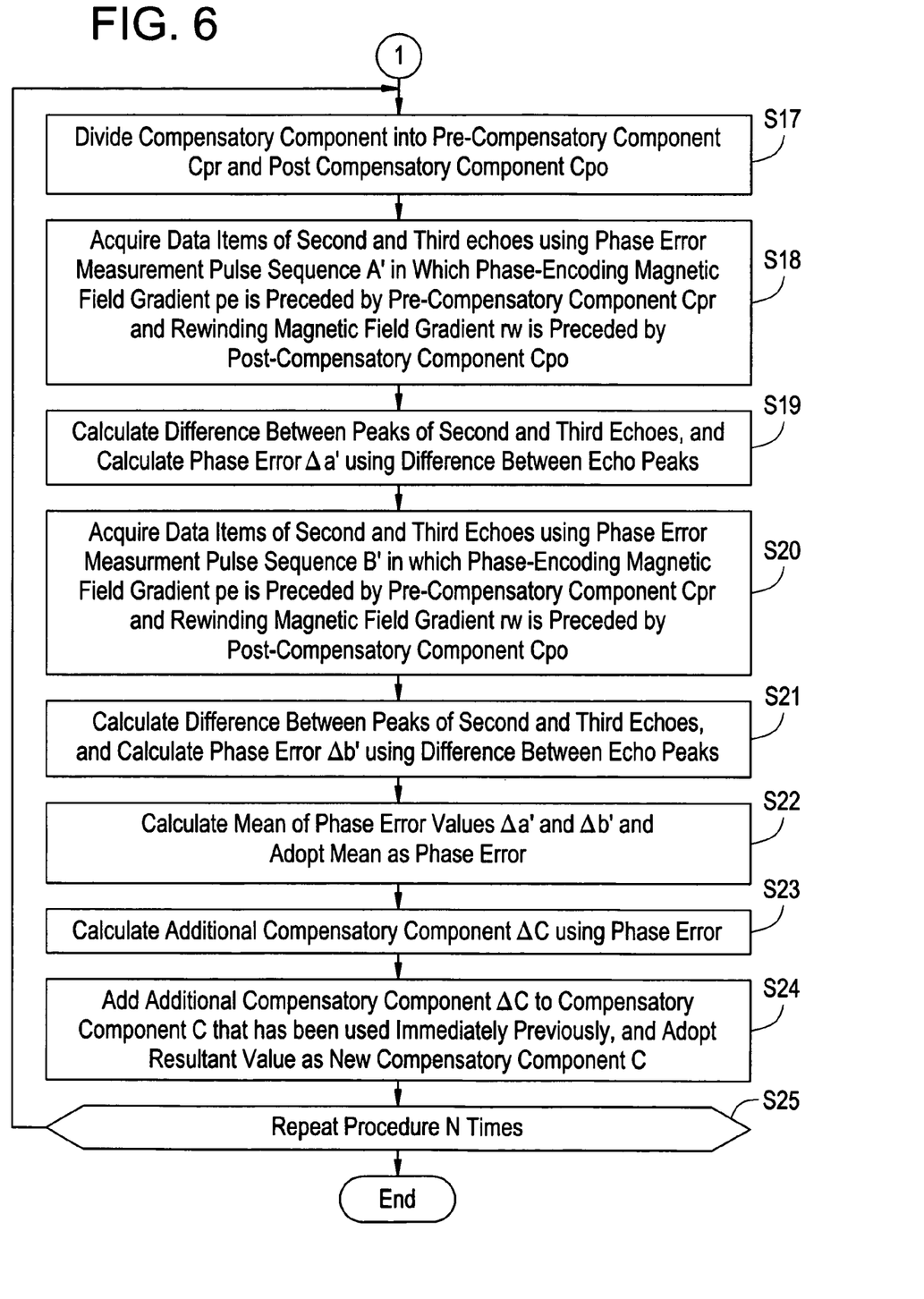
FIG. 6 is a flowchart describing the concrete example of phase error measurement.

A concrete example of phase error measurement of step S1 will be described below. According to the present embodiment, a phase error of each of phase encoding magnetic field gradients defined to be included in the blade is measured. FIG. 5 and FIG. 6 are flowcharts describing a concrete example of phase error measurement in accordance with the present embodiment.

Figure 7:
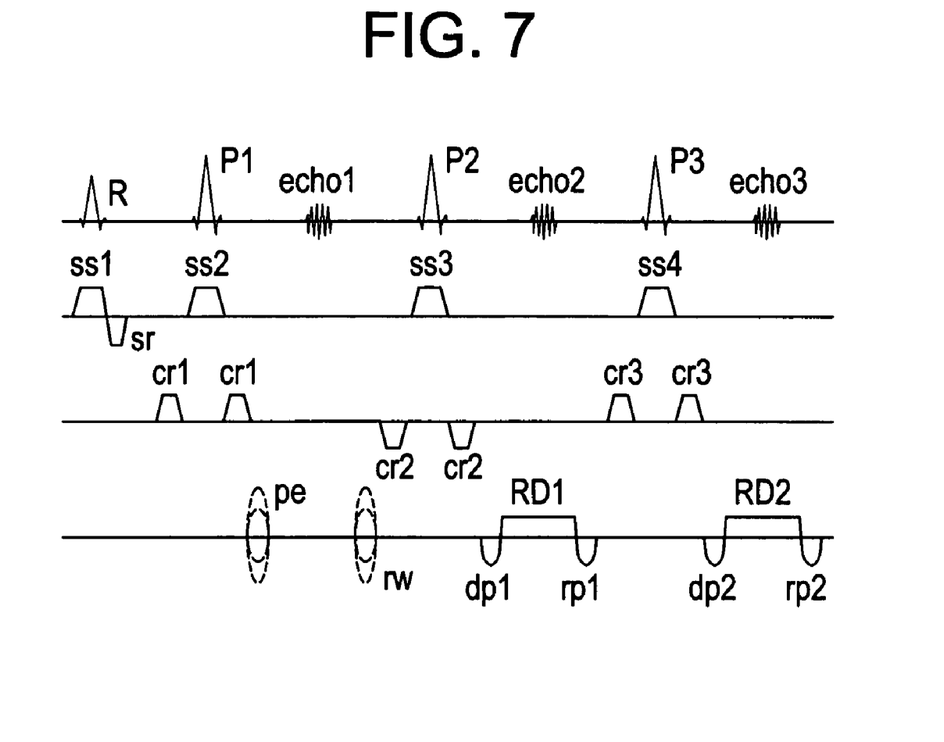
FIG. 7 shows a phase error measurement pulse sequence A.

First, the computer 7 uses a phase error measurement pulse sequence A, which is stored in the sequence memory circuit 8, to acquire data items of the second and third echoes echo2 and echo3 (step S11 in FIG. 5). FIG. 7 shows the phase error measurement pulse sequence A.

According to the phase error measurement pulse sequence A shown in FIG. 7, an exciting pulse R and a slice-selective magnetic field gradient ss1 are applied. Thereafter, a first inverting pulse P1 and a slice-selective magnetic field gradient ss2 are applied, and a first crushing magnetic field gradient cr1 of positive polarity is applied before and after the application of the first inverting pulse P1 along a readout axis. Thereafter, a phase-encoding magnetic field gradient pe is applied along a phase axis. Furthermore, a rewinding magnetic field gradient is applied along the phase axis. Thereafter, a second inverting pulse P2 and a slice-selective magnetic field gradient ss3 are applied, and a second crushing magnetic field gradient cr2 of negative polarity is applied before and after the application of the second inverting pulse P2 along the readout axis. Thereafter, a dephasing magnetic field gradient dp1 is applied along the phase axis. Thereafter, while a readout magnetic field gradient RD1 is applied along the phase axis, an NMR signal of the second echo echo2 is received. Thereafter, a rephasing magnetic field gradient rp1 whose strength is equal to the strength of the dephasing magnetic field gradient dp1 is applied along the phase axis. Thereafter, a third inverting pulse P3 and a slice-selective magnetic field gradient ss4 are applied, and a third crushing magnetic field gradient cr3 of positive polarity is applied before and after the application of the third inverting pulse P3 along the readout axis. Thereafter, a dephasing magnetic field gradient dp2 is applied along the phase axis. Thereafter, while a readout magnetic field gradient RD2 is applied along the phase axis, an NMR signal of the third echo echo3 is received. Thereafter, a rephasing magnetic field gradient rp2 whose strength is equal to the strength of the dephasing magnetic field gradient dp2 is applied along the phase axis.

Thereafter, the computer 7 calculates a difference between the peaks of the second and third echoes echo2 and echo3, and calculates a phase error $\Delta a$ using the difference between the echo peaks (step S12).

Figure 8:
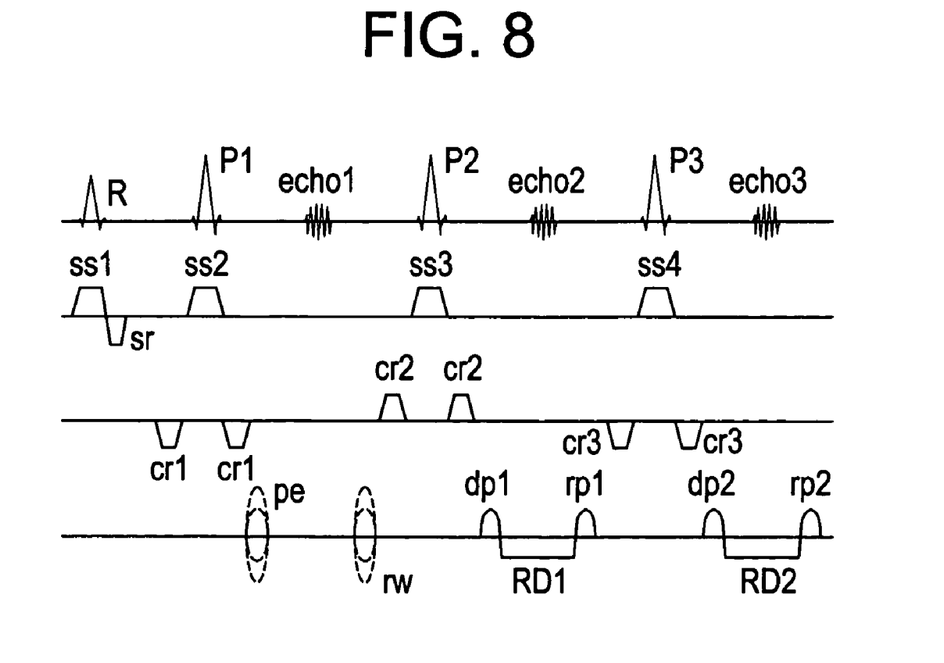
FIG. 8 shows a phase error measurement pulse sequence B.

Thereafter, the computer 7 uses a phase error measurement pulse sequence B stored in the sequence memory circuit 8 to acquire data items of the second and third echoes echo2 and echo3 (step S13). FIG. 8 shows the phase error measurement pulse sequence B. According to the phase error measurement pulse sequence B, the polarities of the crushing magnetic field gradients cr, dephasing magnetic field gradients dp, readout magnetic field gradients RD, and rephasing magnetic field gradients rp which are employed in the phase error measurement pulse sequence A shown in FIG. 7 are reversed.

Thereafter, the computer 7 calculates a difference between the peaks of the second and third echoes echo2 and echo3 acquired at step S13, and calculates a phase error $\Delta b$ using the difference between the echo peaks (step S14).

Thereafter, the computer 7 calculates a mean of the phase error values $\Delta a$ and $\Delta b$, and adopts the mean as a phase error (step S15). Thereafter, based on the phase error, the computer 7 calculates a compensatory component C to be used to compensate the phase error (step S16).

Thereafter, the computer 7 divides the compensatory component C calculated at step S16 into a pre-compensatory component Cpr and a post-compensatory component Cpo (step S17 in FIG. 6). The division ratio may be basically 1:1 but may be set to any ratio other than 1:1 depending on each MRI apparatus.

Figure 9:
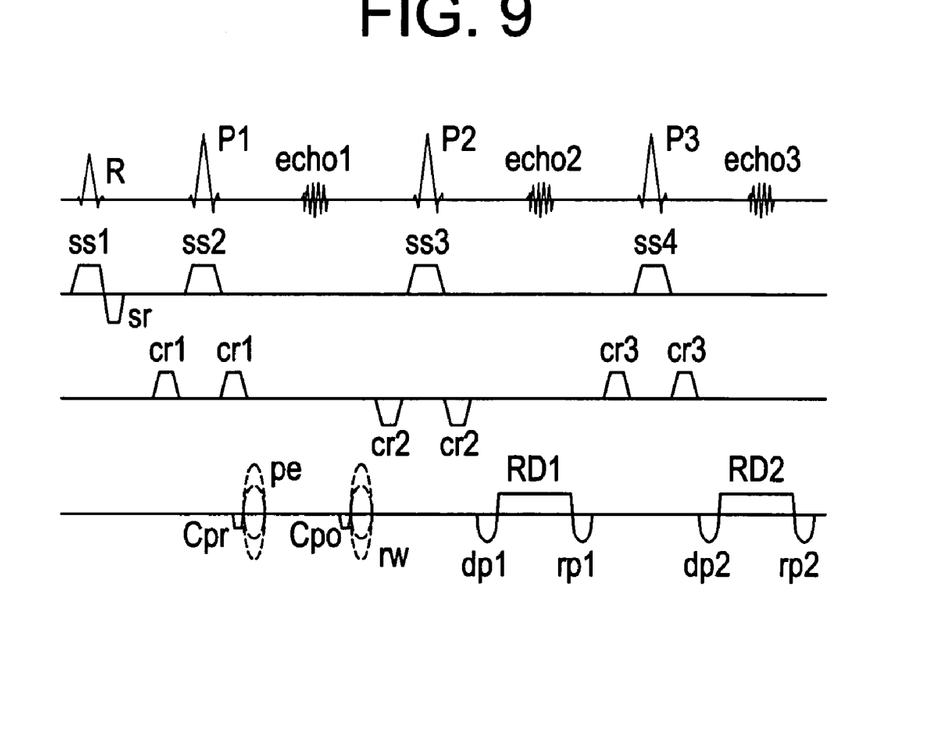
FIG. 9 shows a phase error measurement pulse sequence A'.

Thereafter, the computer 7 produces a phase error measurement pulse sequence A' in which the application of the pre-compensatory component Cpr precedes the application of the phase-encoding magnetic field gradient pe and the application of the post-compensatory component Cpo precedes the application of the rewinding magnetic field gradient rw. The computer 7 then stores the pulse sequence A' in the sequence memory circuit 8. The phase error measurement pulse sequence A' is used to acquire data items of the second and third echoes (step S18). FIG. 9 shows the phase error measurement pulse sequence A'.

Thereafter, the computer 7 calculates a difference between the peaks of the second and third echoes echo2 and echo3 acquired at step S18, and calculates a phase error $\Delta a'$ using the difference between the echo peaks (step S19).

Figure 10:
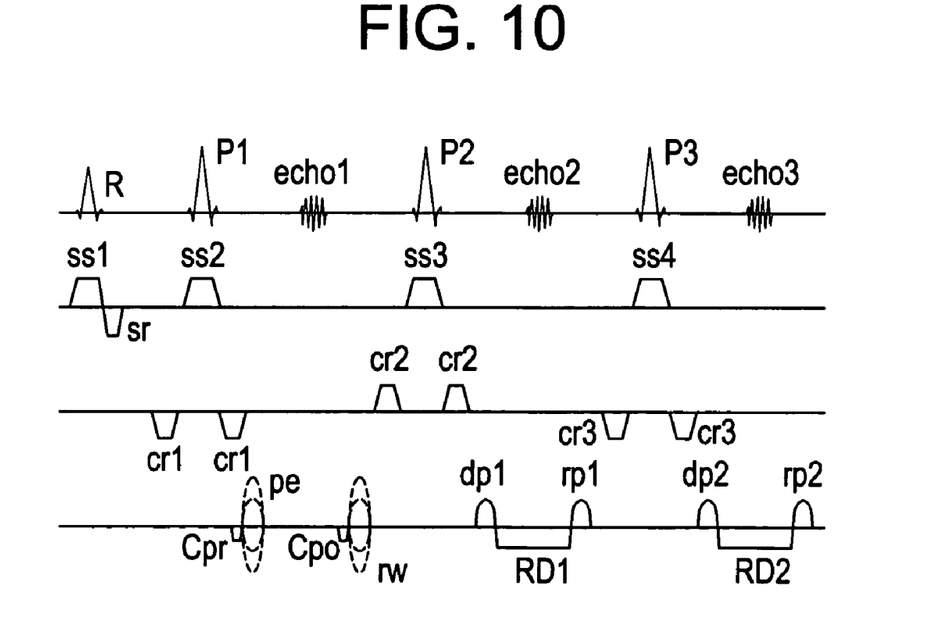
FIG. 10 shows a phase error measurement pulse sequence B'.

Thereafter, the computer 7 produces a phase error measurement pulse sequence B' in which the application of the pre-compensatory component Cpr precedes the application of the phase-encoding magnetic field gradient pe and the application of the post-compensatory component Cpo precedes the application of the rewinding magnetic field gradient rw. The computer 7 then stores the pulse sequence B' in the sequence memory circuit 8. The phase error measurement pulse sequence B' is used to acquire data items of the second and third echoes (step S20). FIG. 10 shows the phase error measurement pulse sequence B'.

Thereafter, the computer 7 calculates the difference between the peaks of the second and third echoes echo2 and echo3 acquired at step S20, and calculates a phase error $\Delta b'$ using the difference between the echo peaks (step S21).

Thereafter, the computer 7 calculates a mean of the phase error values $\Delta a'$ and $\Delta b'$, and adopts the mean as a phase error (step S22). Thereafter, based on the phase error, an additional compensatory component $\Delta C$ to be used to compensate the phase error is calculated (step S23). The additional compensatory component $\Delta C$ is added to the compensatory component C that has been used immediately previously, and the result is adopted as a new compensatory component C (step S24).

Thereafter, the computer 7 executes steps S17 to S24 repeatedly K ($\geq 1$) times (step S25), and obtains the compensatory component C for use in compensating the phase error of the specific phase-encoding magnetic field gradient pe.

According to the present embodiment, in the case shown in FIG. 4 (the echo train length (ETL), that is, the number of echoes equals M=4), the pieces of processing described in FIG. 5 and FIG. 6 may be executed in order to compensate phase errors of phase-encoding magnetic field gradients defined to be included in the blade. Alternatively, for example, phase errors of appropriately thinned phase-encoding magnetic field gradients, that is, phase-encoding quantities defined on m phase encoding lines out of M (=4) phase encoding lines (where m denotes an integer ranging from 1 to M) may be measured. A phase error of a phase-encoding magnetic field gradient that has not been measured may be interpolated or extrapolated. In this case, the number of times of measurement can be decreased.

The phase error measurement may be performed immediately before a main scan is performed on a patient for MR imaging. However, in this case, a throughput offered by the MRI apparatus is degraded. According to the present embodiment, the foregoing phase error measurement may be performed on different types of patients, determined compensatory components may be stored in the memory, and a compensatory component for a type of patient similar to a patient to be scanned for MR imaging may be read from the memory.

More simply, a compensatory component C calculated by executing steps S11 to S16 described in FIG. 5 may be used as it is. Further more simply, the compensatory component C may be calculated from the phase error $\Delta a$ calculated by executing steps S11 and S12 described in FIG. 5, and then adopted. Likewise, the compensatory component C may be calculated from the phase error $\Delta b$ calculated by executing steps S13 and S14 described in FIG. 5, and then adopted.

The phase error measurement in accordance with the present embodiment described in FIG. 5 and FIG. 6 is a mere example. Any other phase error measurement may be adopted (as long as the phase error measurement can fit data, which is acquired from a shifted position or into an enlarged position, into data that is supposed to be acquired from or into a correct position).

Figure 11:
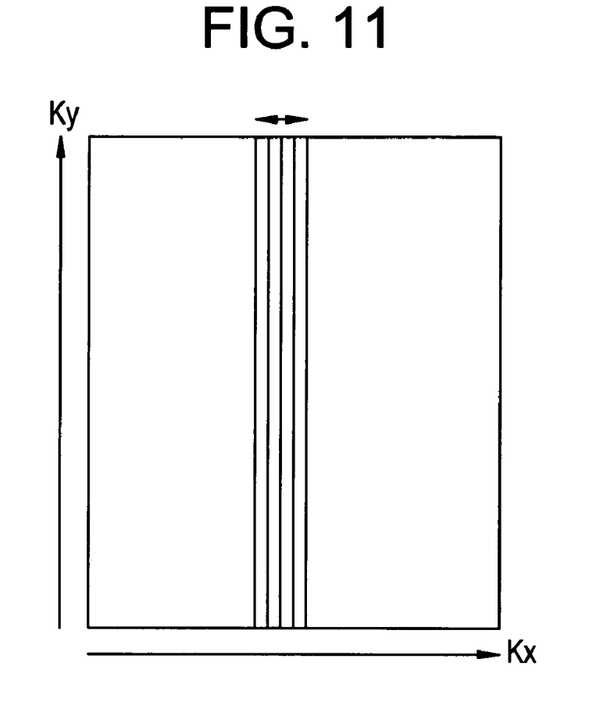
FIG. 11 shows phase error measurement of step S2 described in FIG. 2.

Referring back to FIG. 2, after phase error measurement is performed at step S1, the computer 7 measures a phase error occurring in a phase encoding direction corresponding to the direction of a specific readout line included in a blade parallel to the Ky axis (step S2). FIG. 11 shows phase error measurement of step S2.

The phase error measurement of step S2 is performed according to the same procedure as the procedure (step S11 to S25) of step S1.

Assuming that the number of blades is N, the phase error measurement of step S1 or S2 (measurement of a phase error caused by remanent magnetization) is performed relative to N blades. At this time, either of "measurement of phase errors of all phase encoding magnetic gradients that are defined to be included in a blade" or "measurement of phase errors of appropriately thinned phase encoding magnetic field gradients (including interpolation)" is carried out. The present invention is not limited to this mode. Alternatively, either "measurement of phase errors of all phase-encoding magnetic field gradients defined to be included in a blade" or "measurement of phase errors of appropriately thinned phase-encoding magnetic field gradients" may be performed relative to n blades out of N blades (where n denotes any integer ranging from 1 to N). In this case, a compensatory component for use in compensating a phase error of a magnetic field gradient which has not been measured (any other than n magnetic field gradients) may be interpolated.

Figure 12:
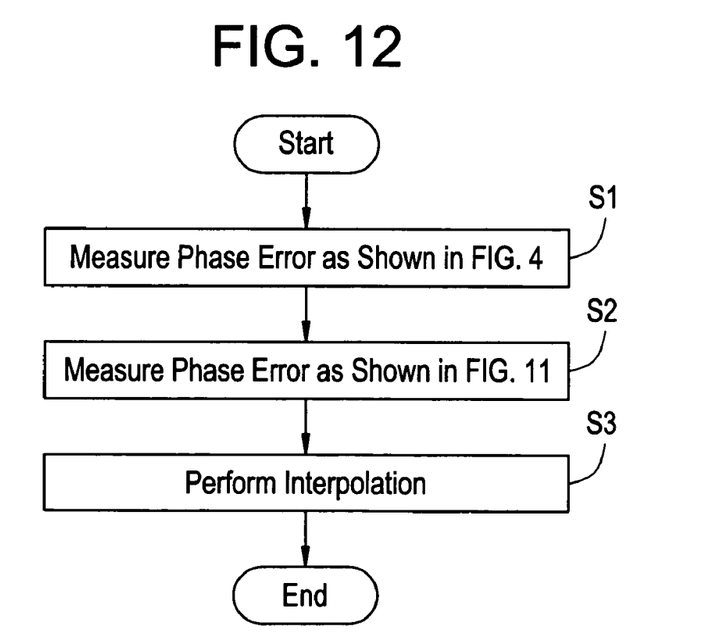
FIG. 12 is a flowchart describing an example of phase error measurement accompanied by interpolation.
Figure 13:
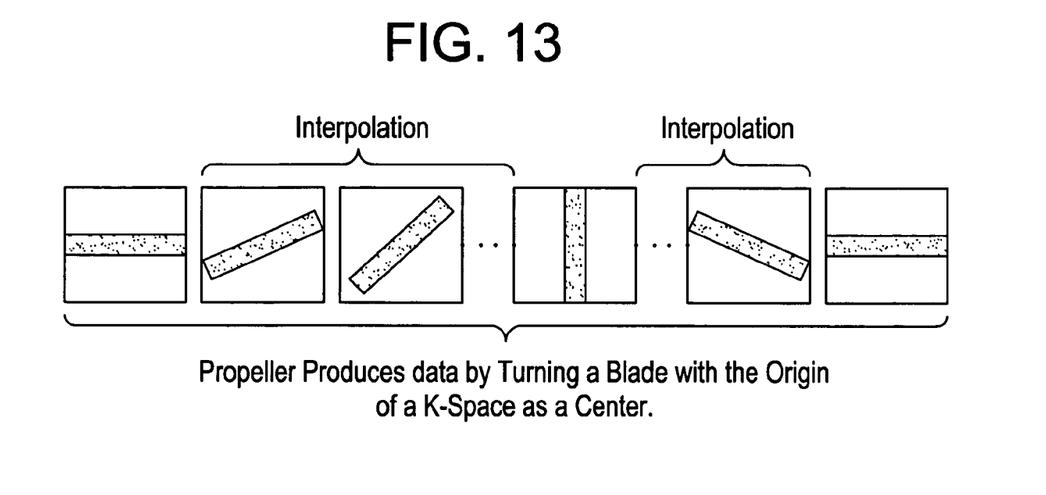
FIG. 13 shows interpolation.

FIG. 12 is a flowchart describing an example of phase error measurement to be accompanied by interpolation. FIG. 13 shows the interpolation. Herein, after steps S1 and S2 are completed, a compensatory component for use in compensating a phase error of each of phase-encoding magnetic field gradients defined to be included in any of blades parallel to all the axes of the K-space, that is, the Kx axis, Ky axex, and mixed axis is interpolated (step S3). The interpolation may be performed according to any method, such as, linear combination, trigonometric-function combination, coefficient combination taking account of apparatus characteristics as long as the method employs the results of phase error measurement of step S1 or S2 (including the results of measurement of phase errors of phase-encoding magnetic field gradients defined on m phase encoding lines).

Figure 14:
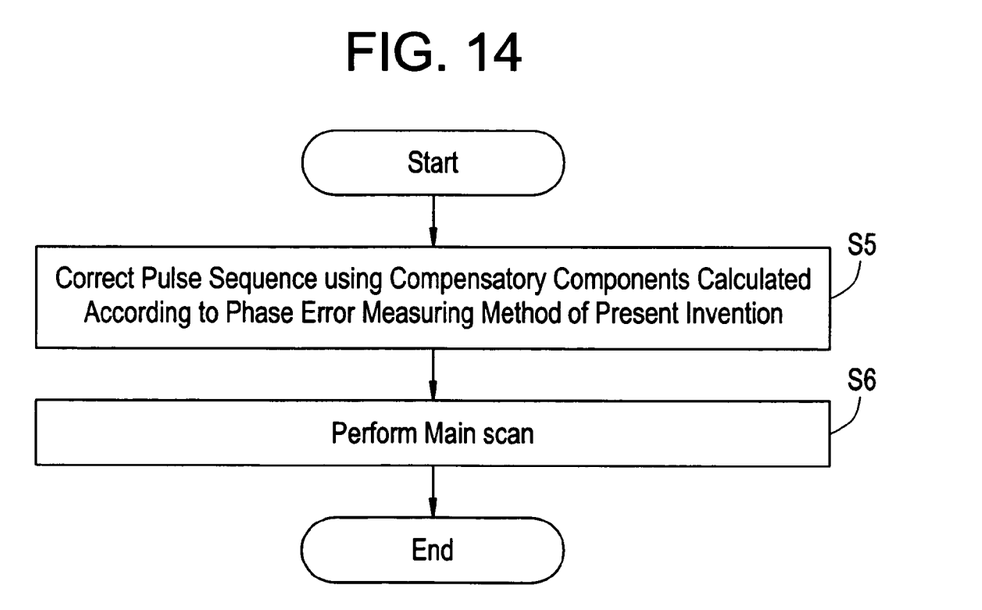
FIG. 14 is a flowchart describing an example of an MR imaging method.

Next, an MR imaging method in which data is acquired according to the PROPELLER method will be described below. FIG. 14 is a flowchart describing an example of the MR imaging method in accordance with the present embodiment.

The computer 7 corrects a PROPELLER imaging pulse sequence using compensatory components calculated through the foregoing phase error measurement (step S5), and stores the corrected pulse sequence in the sequence memory circuit 8.

Figure 15:
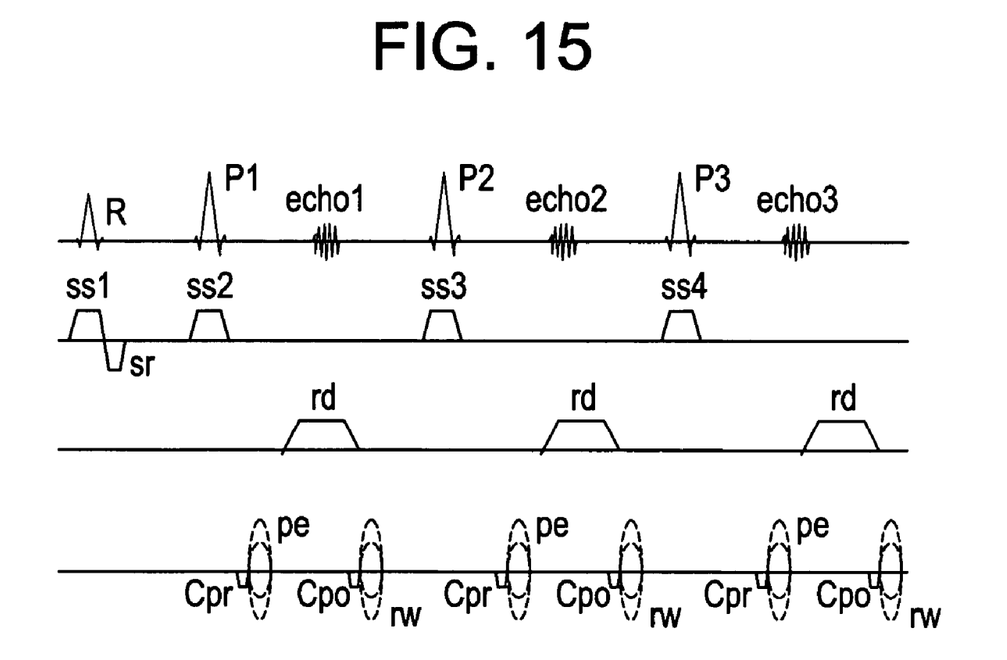
FIG. 15 shows an example of a PROPELLER pulse sequence.

Now, an example of correction of step S5 will be described below. FIG. 15 shows an example of the PROPELLER imaging pulse sequence.

First, the computer 7 divides a compensatory component C, which depends on the strength of a phase-encoding magnetic field gradient pe, into a pre-compensatory component Cpr and a post-compensatory component Cpo. The division ratio may be basically 1:1 but may be set to any ratio other than 1:1 depending on each MRI apparatus.

Thereafter, an uncorrected pulse sequence is corrected. According to the uncorrected pulse sequence, an echo convergence RF pulse for use in converging an echo is transmitted, and a phase-encoding magnetic field gradient pe is applied along the phase axis. While a readout magnetic field gradient rd is applied along the readout axis, data of the echo is acquired. Application of a rewinding magnetic field gradient along the phase axis is repeated a plurality of times while the phase-encoding magnetic field gradient is being changed. MR imaging data items of echoes are sequentially acquired. To the uncorrected pulse sequence, the application of the pre-compensatory component Cpr is added so that it will precede the application of the phase-encoding magnetic field gradient pe. Moreover, the application of the post-compensatory component Cpo is added so that it will precede the application of the rewinding magnetic field gradient rw. Thus, an updated pulse sequence is completed.

The computer 7 uses the pulse sequence updated through correction if step S5 to perform a main scan (step S6), and then acquires data resulting from the PROPELLER imaging.

In the correction, the application of the pre-compensatory component Cpr may succeed the application of the phase-encoding magnetic field gradient pe, and the pre-compensatory component Cpr may be applied in the form of a compensatory pulse. Likewise, the application of the post-compensatory component Cpe may succeed the application of the rewinding magnetic field gradient rw, and the post-compensatory component Cpe may be applied in the form of a compensatory pulse. Moreover, the pre-compensatory component Cpr may be divided into two compensatory pulses, and the applications of the respective compensatory pulses may precede or succeed the application of the phase-encoding magnetic field gradient pe. Likewise, the post-compensatory component Cpo may be divided into two compensatory pulses, and the applications of the respective compensatory pulses may precede or succeed the application of the rewinding magnetic field gradient rw. Furthermore, the application of the pre-compensatory component Cpr may be determined to cover an area to which the phase-encoding magnetic field gradient pe has been applied. Likewise, the application of the post-compensatory component Cpo may be determined to cover an area to which the rewinding magnetic field gradient rw has been applied.

The present embodiment has been described in relation to a phase error measuring method and an MR imaging method to be implemented in a case where a K-space filling scan is performed in order to define data in a K-space that has readout lines formed along a Kx axis, a Ky axis, and a mixed axis of them, that is, in a case where data is acquired according to the PROPELLER imaging method. The present invention is not limited to the case. The present invention can be applied to a case where the VIPR method is adopted, that is, in a case where a K-space filling scan is performed in order to define data in a K-space (expanded three-dimensionally) having readout lines formed along the Kx axis, the Ky axis, a Kz axis, and a mixed axis of them.

As mentioned above, according to the present embodiment, a phase error occurring in each phase encoding direction corresponding to the direction of a readout magnetic field gradient that is turned in units of a radian is measured and compensated. During data acquisition, an accurate phase-encoding quantity can be defined on phase-encoding lines corresponding to readout lines formed parallel to a Kx axis, a Ky axis, and a mixed axis of them or parallel to the Kx axis, the Ky axis, a Kz axis, and a mixed axis of them. Consequently, compared with related arts, blurs or artifacts in images can be drastically reduced. Moreover, since images little affected by the blurs or artifacts can be produced, the images will be found clinically valuable.

Many widely different embodiments of the invention may be configured without departing from the spirit and the scope of the present invention. It should be understood that the present invention is not limited to the specific embodiments described in the specification, except as defined in the appended claims.

The invention claimed is:

1. A phase error measuring method to be implemented in an MRI apparatus that performs a K-space filling scan so as to define data in a K-space having readout lines formed along a Kx axis, a Ky axis, and a mixed axis of them, comprising:

a plurality of phase error measurement steps of measuring a phase error that occurs in each phase encoding direction corresponding to the direction of a readout magnetic field gradient which is turned in units of a radian, wherein at the phase error measuring steps, a phase error is measured in units of a blade that is a unit of data to be acquired, and a compensatory component for use in compensating a phase error of a phase-encoding magnetic field gradient is calculated for all phase-encoding magnetic field gradients defined to be included in a blade.

2. A phase error measuring method according to claim 1 further comprising defining data in K-space having readout lines formed along the Kx axis, the Ky axis, a Kz axis, and a mixed axis of them.

3. A phase error measuring method according to claim 1 wherein said plurality of phase error measurement steps comprises using a first predetermined phase error measurement sequence to acquire data, wherein the first phase error measurement sequence has a first set of gradient polarities.

4. A phase error measuring method according to claim 3 wherein said plurality of phase error measurement steps comprises using a second predetermined phase error measurement sequence to acquire data, wherein the second phase error measurement sequence has a second set of gradient polarities that are opposite to the first set of gradient polarities.

5. A phase error measuring method according to claim 1 further comprising defining a first component and a second component within the compensatory component.

6. A phase error measuring method according to claim 5 further comprising applying the first and second components of the compensatory component to a first predetermined phase error measurement sequence to acquire first data items.

7. A phase error measuring method according to claim 6 further comprising applying the first and second components of the compensatory component to a second predetermined phase error measurement sequence to acquire second data items, wherein the second phase error measurement sequence comprises a set of gradients having polarities oppose to polarities of gradients within the first phase error measurement sequence.

8. A phase error measuring method according to claim 7 further comprising calculating a first phase error based on the first data items and calculating a second phase error based on the second data items.

9. A phase error measuring method according to claim 8 further comprising calculating a phase error compensatory component using the first phase error and the second phase error, wherein the compensatory component includes the phase error compensatory component.

10. A phase error measuring method according to claim 1 further comprising interpolating a compensatory component for use in compensating a phase error that occurs in a phase encoding direction but has not been measured.

11. A phase error measuring method to be implemented in an MRI apparatus that performs a K-space filling scan so as to define data in a K-space having readout lines formed along a Kx axis, a Ky axis, and a mixed axis of them, comprising:
a plurality of phase error measurement steps of measuring a phase error that occurs in each phase encoding direction corresponding to the direction of a readout magnetic field gradient which is turned in units of a radian, wherein:
at the phase error measuring steps, a phase error is measured in units of a blade that is a unit of data to be acquired, and a compensatory component for use in compensating a phase error of a phase-encoding magnetic field gradient is calculated for phase-encoding magnetic field gradients arbitrarily selected from among all phase-encoding magnetic field gradients defined to be included in a blade.

12. The phase error measuring method according to claim 11, wherein a compensatory component for use in compensating a phase error of a phase-encoding magnetic field gradient which has not been measured is interpolated.

13. A phase error measuring method to be implemented in an MRI apparatus that performs a K-space filling scan so as to define data in a K-space having readout lines formed along a Kx axis, a Ky axis, and a mixed axis of them, comprising:
a plurality of phase error measurement steps of measuring a phase error that occurs in each phase encoding direction corresponding to the direction of a readout magnetic field gradient which is turned in units of a radian, wherein at the plurality of phase error measuring steps, a phase error is measured in all phase encoding directions corresponding to directions in which a readout magnetic field gradient is turned in units of a radian.

14. A phase error measuring method to be implemented in an MRI apparatus that performs a K-space filling scan so as to define data in a K-space having readout lines formed along a Kx axis, a Ky axis, and a mixed axis of them, comprising:
a plurality of phase error measurement steps of measuring a phase error that occurs in each phase encoding direction corresponding to the direction of a readout magnetic field gradient which is turned in units of a radian, wherein at the plurality of phase error measuring steps, a phase error is measured in a plurality of phase encoding directions arbitrarily selected from among all phase encoding directions corresponding to directions in which a readout magnetic field gradient is turned in units of a radian.

15. The phase error measuring method according to claim 14, wherein a compensatory component for use in compensating a phase error that occurs in a phase encoding direction but has not been measured is interpolated.

16. An MRI apparatus performing a K-space filling scan to define data in a K-space having readout lines formed along a Kx axis, a Ky axis, and a mixed axis, said MRI apparatus comprising a computer configured to control measurement of a phase error that occurs in each phase encoding direction corresponding to a direction of a readout magnetic field gradient that is turned in units of a radian, wherein the phase error is measured in units of a blade that is a unit of data to be acquired, wherein said computer configured to control calculation of a compensatory component used in compensating a phase error of a phase-encoding magnetic field gradient, and wherein the compensatory component is calculated for all phase-encoding magnetic field gradients defined to be included in the blade.

17. The MRI apparatus according to claim 16, wherein said computer corrects a main scan pulse sequence using a plurality of results of the phase error measurement performed, wherein said computer stores, in a predetermined storage area, the pulse sequence that has been updated through the correction, and wherein the computer uses the updated pulse sequence to execute a main scan.

18. An MRI apparatus performing a K-space filling scan to define data in a K-space having readout lines formed along a Kx axis, a Ky axis, and a mixed axis, said MRI apparatus comprising a computer configured to control measurement of a phase error that occurs in each phase encoding direction corresponding to a direction of a readout magnetic field gradient that is turned in units of a radian, wherein the phase error is measured in units of a blade that is a unit of data to be acquired, wherein said computer configured to control calculation of a compensatory component used in compensating a phase error of a phase-encoding magnetic field gradient, and wherein the compensatory component is calculated for phase-encoding magnetic field gradients arbitrarily selected from among all phase-encoding magnetic field gradients defined to be included in the blade.

19. The MRI apparatus according to claim 18, wherein said computer corrects a main scan pulse sequence using a plurality of results of the phase error measurement performed, wherein said computer stores, in a predetermined storage area, the pulse sequence that has been updated through the correction, and wherein the computer uses the updated pulse sequence to execute a main scan.

* * * * *